United States Patent
Pavao Moreira et al.

(10) Patent No.: US 11,815,553 B2
(45) Date of Patent: Nov. 14, 2023

(54) DUTY CYCLE DETECTOR SELF-TESTING

(71) Applicant: NXP USA, INC., Austin, TX (US)

(72) Inventors: Cristian Pavao Moreira, Frouzins (FR); Andreas Johannes Köllmann, Rosengarten (DE); Ulrich Moehlmann, Moisburg (DE)

(73) Assignee: NXP USA, INC., Austin, TX (US)

( * ) Notice: Subject to any disclaimer, the term of this patent is extended or adjusted under 35 U.S.C. 154(b) by 226 days.

(21) Appl. No.: 17/336,843

(22) Filed: Jun. 2, 2021

(65) Prior Publication Data

US 2021/0389372 A1 Dec. 16, 2021

(30) Foreign Application Priority Data

Jun. 11, 2020 (EP) .................................. 20305638

(51) Int. Cl.
- *G01R 31/317* (2006.01)
- *G01S 7/40* (2006.01)
- *H03K 3/017* (2006.01)

(52) U.S. Cl.
CPC ...... *G01R 31/31727* (2013.01); *G01S 7/4008* (2013.01); *G01S 7/4021* (2013.01); *H03K 3/017* (2013.01)

(58) Field of Classification Search
CPC .............. G01R 29/02; G01R 31/31708; G01R 31/31727; G01S 7/4008; G01S 7/4021; H03K 3/017
See application file for complete search history.

(56) References Cited

U.S. PATENT DOCUMENTS

| | | | |
|---|---|---|---|
| 7,062,692 B1 | 6/2006 | Lesea | |
| 7,961,559 B2 | 6/2011 | Dixon et al. | |
| 8,344,925 B1* | 1/2013 | Evans | H03M 1/462 |
| | | | 341/120 |
| 8,736,329 B1* | 5/2014 | Rajavi | H03K 5/1565 |
| | | | 327/175 |
| 8,773,186 B1 | 7/2014 | Liou et al. | |
| 9,030,244 B1 | 5/2015 | Luo et al. | |
| 10,601,410 B1* | 3/2020 | Satoh | H03K 3/017 |
| 10,700,672 B2 | 6/2020 | Savary et al. | |
| 2002/0079941 A1 | 6/2002 | Jung et al. | |
| 2007/0075753 A1 | 4/2007 | Parker et al. | |
| 2009/0105978 A1 | 4/2009 | Schuttert et al. | |
| 2017/0337952 A1 | 11/2017 | Shi et al. | |
| 2020/0057465 A1* | 2/2020 | Huang | H03L 7/07 |
| 2020/0220528 A1* | 7/2020 | Koh | G06F 1/10 |
| 2021/0200257 A1* | 7/2021 | Huang | H03C 3/0966 |

FOREIGN PATENT DOCUMENTS

| | | |
|---|---|---|
| EP | 1475907 A1 | 11/2004 |
| WO | 2010018544 A1 | 2/2010 |

* cited by examiner

*Primary Examiner* — Timothy X Pham

(57) ABSTRACT

The disclosure relates to apparatus and methods for self-testing of a duty cycle detector. Example embodiments include a circuit (201) comprising: a clock signal generator (205) configured to provide an output clock signal (203) having a duty cycle; a duty cycle detector (208) arranged to receive the output clock signal (203) and provide an output flag if the duty cycle of the clock signal (203) is outside a predetermined range; a controller (214) arranged to provide a duty cycle select signal (216) to the clock signal generator (205) to cause the clock signal (203) to have a duty cycle outside the predetermined range and to receive the output flag to confirm operation of the duty cycle detector (208).

13 Claims, 9 Drawing Sheets

DUTY CYCLE DETECTOR SELF-TESTING

CROSS-REFERENCE TO RELATED APPLICATIONS

This application claims the priority under 35 U.S.C. § 119 of European Patent application no. 20305638.7, filed on 11 Jun. 2020, the contents of which are incorporated by reference herein.

FIELD

The disclosure relates to apparatus and methods for self-testing of a duty cycle detector.

BACKGROUND

Modern radar applications, such as in automotive safety and guidance systems, require accurate duty cycle detectors for monitoring whether correct clock signals are being provided. Signals having out-of-specification duty cycle values can result in degraded system performance and misinterpreted data outputs. It is therefore important that any duty cycle detector can be determined to be functional and of sufficient accuracy prior to operation of the associated radar transceiver.

ISO26262 in particular, and more generally modern safety requirements (e.g. ASIL B), require the use of duty cycle detectors in signal clock paths for driving critical functions or blocks. Extending this further may also involve being able to test in the field that a duty cycle detector is correctly operating, for example ensure that it is not stuck or sending incorrect information.

SUMMARY

According to a first aspect there is provided a circuit comprising:
- a clock signal generator configured to provide an output clock signal having a duty cycle;
- a duty cycle detector arranged to receive the output clock signal and provide an output flag if the duty cycle of the clock signal is outside a predetermined range;
- a controller arranged to provide a duty cycle select signal to the clock signal generator to cause the clock signal to have a duty cycle outside the predetermined range and to receive the output flag to confirm operation of the duty cycle detector.

The predetermined range may be around 50%, for example between around 45 and 55%.

The controller may be configured, in a first mode, to provide a first duty cycle select signal to cause the clock signal generator to provide the output clock signal with a first duty cycle within the predetermined range and, in a second mode, to provide a second duty cycle select signal to cause the clock signal generator to provide the output clock signal with a second duty cycle outside the predetermined range.

The clock signal generator may comprise a clock signal divider and a duty cycle generator arranged to receive a plurality of clock signal phases from the clock signal divider and output the clock signal having a duty cycle determined by the duty cycle select signal.

The duty cycle generator may comprise a logic module and a multiplexer, the logic module arranged to combine the plurality of clock signal phases and output a plurality of clock signals with differing duty cycles to the multiplexer, the multiplexer selecting the output clock signal dependent on the duty cycle select signal.

The logic module may comprise:
- a first AND gate arranged to receive one of the plurality of clock signal phases and a logic 1 and output a first clock signal having a duty cycle within the predetermined range.

The logic module may comprise:
- a second AND gate arranged to receive a pair of the plurality of clock signal phases and output a second clock signal having a duty cycle outside the predetermined range.

The logic module may comprise:
- a third AND gate arranged to receive the pair of the plurality of clock signal phases and having an inverted output to output a third clock signal having a duty cycle outside the predetermined range.

The plurality of clock signal phases may comprise a first clock signal at a first phase and second clock signal at a second phase, the second phase being shifted from the first phase by 270°.

The clock signal generator may comprise a plurality of duty cycle generators each arranged to receive a plurality of clock signal phases from a respective clock signal divider and output a clock signal dependent on a duty cycle select signal received from the controller.

A radar transceiver may comprise a clock signal generator according to the first aspect.

The radar transceiver may comprise master and slave transceivers each comprising a clock signal generator according to the first aspect, wherein a phase of a clock signal output by each clock signal generator is adjustable according to a phase select input signal.

According to a second aspect there is provided a method of testing a duty cycle detector connected to a clock signal generator in a circuit according to the first aspect, the method comprising:
  i) providing a duty cycle select signal to the clock signal generator to cause the clock signal to have a duty cycle outside the predetermined range; and
  ii) detecting an output flag from the duty cycle detector to confirm operation of the duty cycle detector.

Step i) may comprise:
  ia) providing a first duty cycle select signal to the clock signal generator to cause the clock signal to have a duty cycle above the predetermined range; and
  ib) providing a second duty cycle select signal to the clock signal generator to cause the clock signal to have a duty cycle below the predetermined range,
  wherein step ii) comprises detecting the output flag from the duty cycle detector after both steps ia) and ib) to confirm operation of the duty cycle detector.

The clock signal generator may be provided as part of a radar transceiver.

The radar transceiver may comprising master and slave transceivers each comprising a clock signal generator according to the first aspect, the method comprising aligning a phase of a clock signal of the slave transceiver and the master transceiver to provide an aligned phase clock signal for the duty cycle generator of each clock signal generator. Aligning the phase of the master and slave clock signals ensures that the duty cycle generators do not change the aligned phase during a duty cycle detection testing mode.

By generating a signal with a deliberately out-of-specification duty cycle, a duty cycle detector can be tested to determine whether it is correctly working and, if not, a flag can be generated as an output of a system self-test routine.

According to a third aspect there is provided a computer program comprising instructions to cause a controller to perform the method according to the second aspect.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a non-transitory computer readable medium, which may be a physical computer readable medium, such as a disc or a memory device, or may be embodied as a transient signal. Such a transient signal may be a network download, including an internet download.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
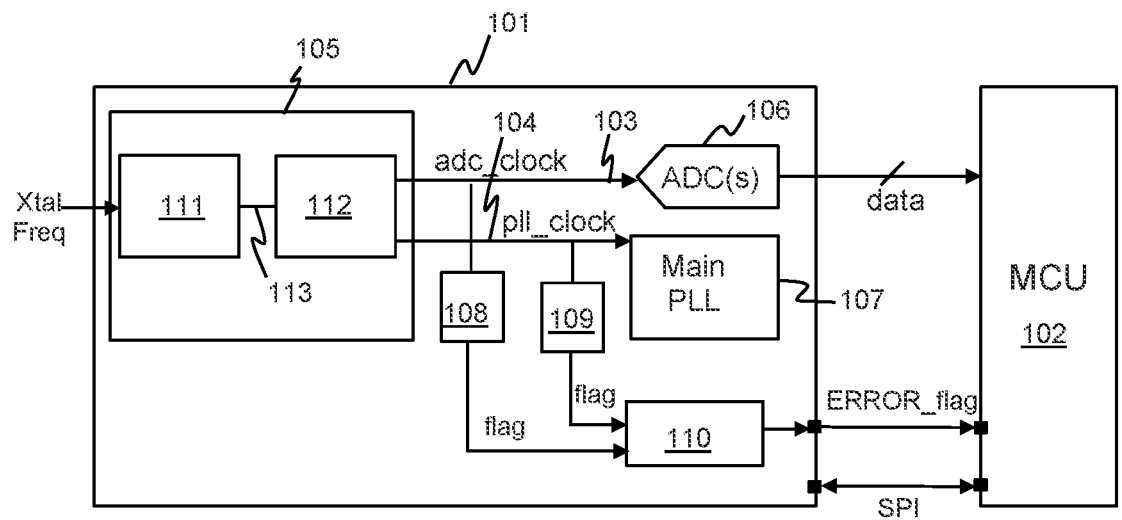
FIG. 1 is a schematic diagram of a circuit comprising a clock signal generator.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 illustrates a clock signal module 101 and master control unit (MCU) 102, in which clock signals 103, 104 are generated by a reference phase locked loop (PLL) module 105. The clock signal module 101 may for example form part of a radar transceiver, in which the clock signals are used to drive operation of various other components of a transmitter and/or receiver part of the transceiver. The reference PLL module 105 receives an input clock signal at a crystal frequency and generates a clock signal 113 with a clock PLL 111, which is provided to a clock signal divider 112. The clock signal divider 112 generates the clock signals 103, 104, which are provided to an analogue to digital converter (ADC) 106 and main PLL 107. The clock signals 103, 104 are monitored by first and second duty cycle detectors 108, 109. Each detector 108, 109 provides an output flag to a safety controller 110 if an error is detected in the respective clock signal 103, 104. The safety controller 110 provides an error flag to the MCU 102 indicating which clock signal 103, 104 is out of range. An out of range clock signal will mean that data dependent on the clock signal is probably corrupted, or a function is not operating as expected or with degraded performance. The data processed for any frame in which a flag is raised should therefore be discarded at the application level.

A problem with the above described clock signal module is that an out-of-specification duty cycle in any of the clock signals will only be detected if the duty cycle detectors 108, 109 are operating correctly. If either of the detectors 109, 109 is not functional, errors in the duty cycle of the respective clock signal 103, 104 will not be detected and errors will then result in data processed dependent on these clock signals.

Figure 2:
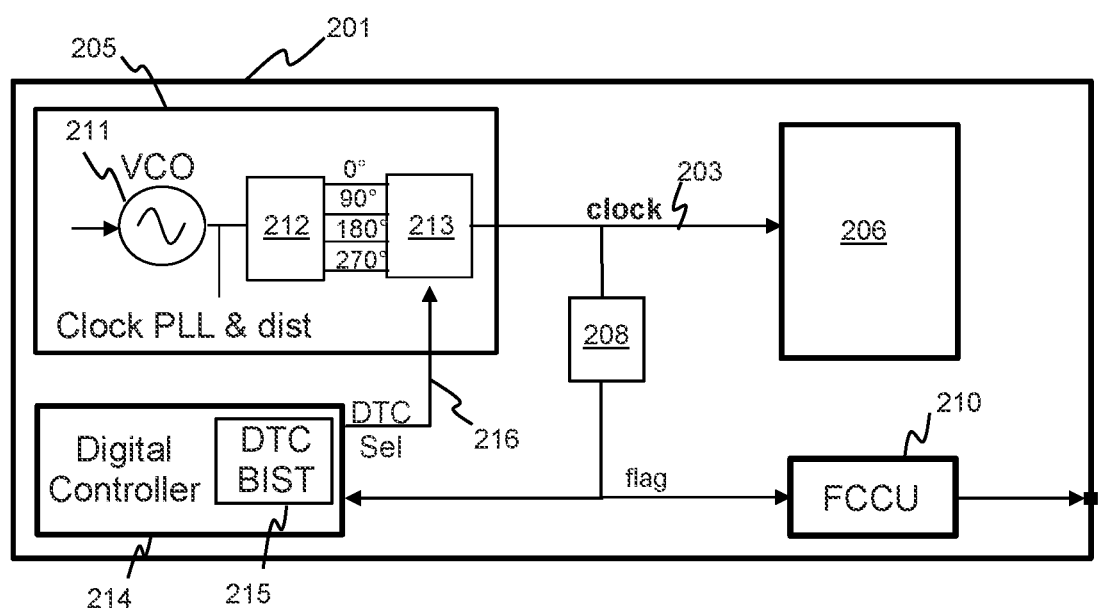
FIG. 2 is a schematic diagram of an example clock signal generator with a duty cycle detector and self-test capability.

FIG. 2 illustrates a clock signal module 201 configured to address the above-mentioned problem. A clock signal generator 205 is arranged to generate a clock signal 203 having a defined duty cycle. The clock signal 203 is provided to a block or function 206 (such as the ADC 106 or Main PLL 107 shown in FIG. 1) that requires the clock signal 203 to operate. The clock signal generator 205 comprises a voltage controlled oscillator (VCO) 211 and divider 212. In addition, the clock signal generator 205 comprises a duty cycle generator 213, which is arranged to provide the output clock signal 203 with a predetermined duty cycle. Operation of the duty cycle generator 213 is controlled by a digital controller 214, which incorporates a built-in self-test (BIST) mode 215. A duty cycle select signal 216 is provided to the duty cycle generator 213 to select one of a plurality of available duty cycles to be applied to the clock signal 203. A duty cycle detector 208 monitors the clock signal 203 and provides a flag signal to a fault collection central unit (FCCU) 210 in the event that an out-of-range duty cycle is detected in the clock signal 203. The flag signal is also provided to the digital controller 214 for use in the BIST mode 215.

Figure 3A:
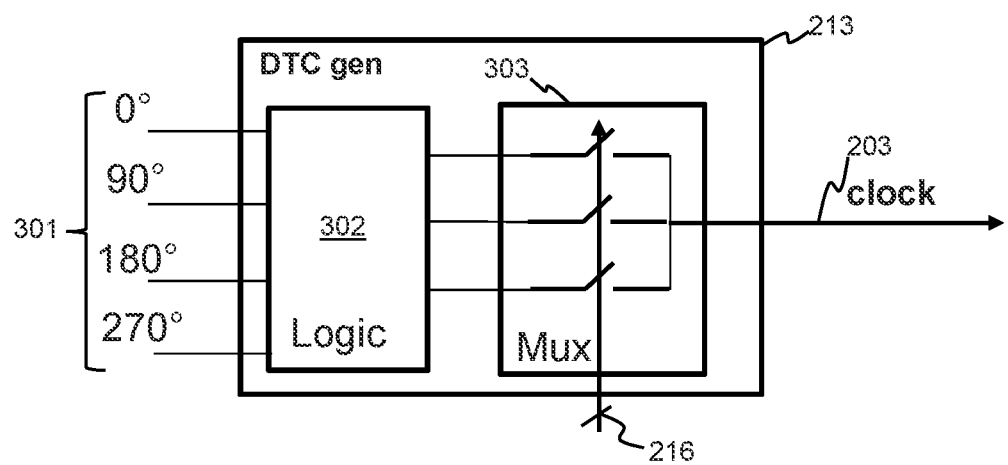
FIG. 3a is a detailed schematic illustration of an example duty cycle generator.
Figure 3B:
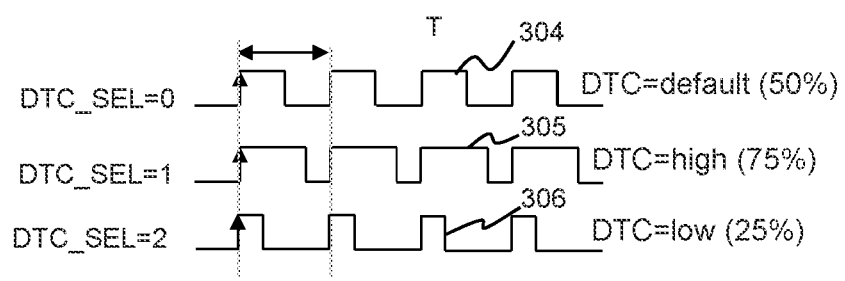
FIG. 3b is an illustration of a series clock signals provided by the duty cycle generator of FIG. 3a having differing duty cycles.

A more detailed diagram of the duty cycle (DTC) generator 213 is shown in FIG. 3a. The DTC generator 213 receives a plurality of clock signals 301 from the divider 212, the clock signals 301 differing from each other by phase shifts. In the example shown in FIG. 3a there are four clock signals 301 with phase shifts at 0, 90, 180 and 270 degrees. These clock signals 301 are provided to a logic module 302, which logically combines the clock signals and provides outputs to a multiplexer 303. The multiplexer 303 is controlled by the DTC select signal 216 provided by the digital controller 214. In the example shown, the DTC select signal 216 enables three predefined duty cycle values to be selected, as shown in FIG. 3b. Selecting 0 enables a standard 50% duty cycle clock signal 304. Selecting 1 enables a 75% duty cycle clock signal 305. Selecting 2 enables a 25% duty cycle clock signal. Other arrangements of the logic module 302 and multiplexer 303 may enable different duty cycle values to be selected. The principle described herein is not restricted to phase differences having a multiple of 90° but may apply to other multiples such as 45° or 60°, including uneven intervals. If a higher resolution around a particular phase is required, unequal phase differences may be taken into account.

The ability to output predefined duty cycle values in the clock signal 203 enables the BIST mode 215 of the digital controller 214 to test operation of the DTC detector 208. If the DTC select signal is provided to generate either the high (75%) or low (25%) duty cycle, the DTC detector 208 should immediately detect an out-of-range clock signal and generate a flag. This can be used by the DTC BIST 215 to check that the DTC detector 208 is operating correctly.

Figure 4:
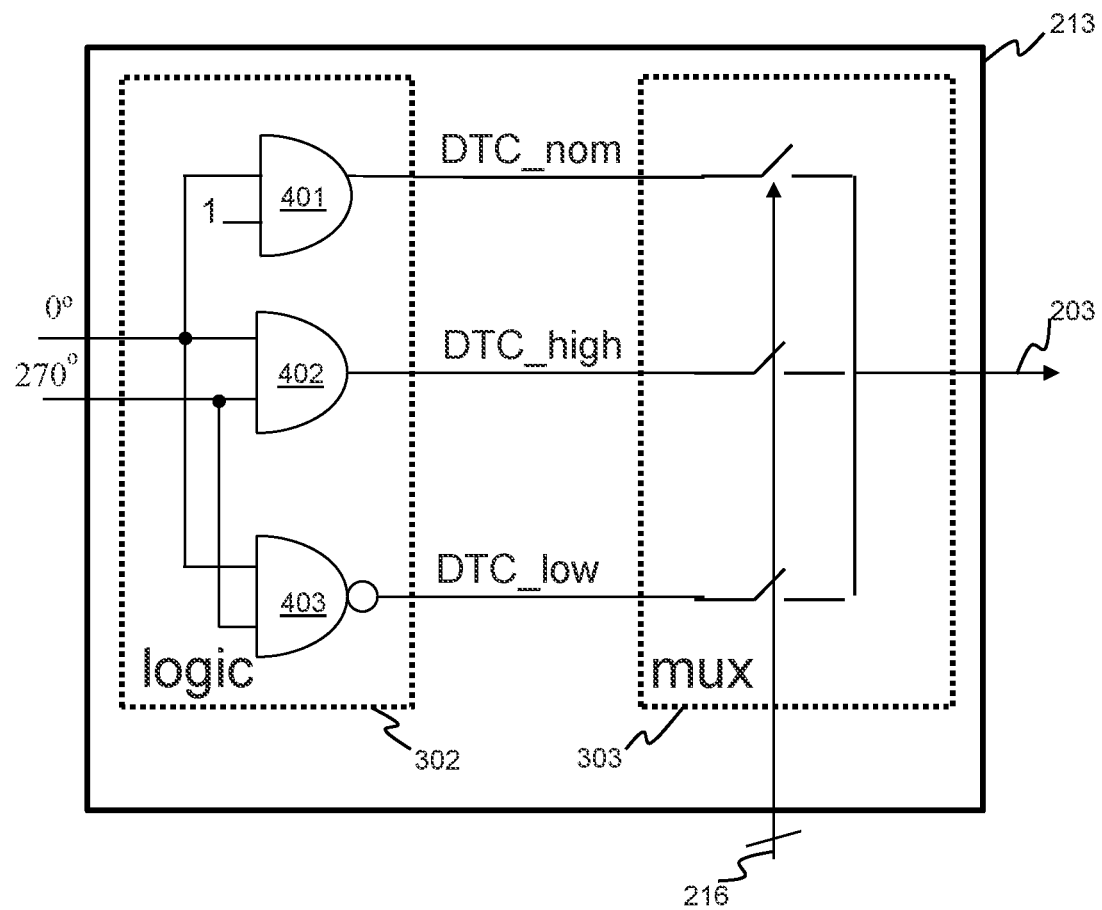
FIG. 4 is a schematic diagram of an example duty cycle generator.

A more detailed example of the DTC generator 213 is illustrated in FIG. 4, showing an example arrangement of the logic module 302. Two clock signal outputs from the divider with phases at 0 and 270 degrees are input to an arrangement of three AND gates 401, 402, 403, one of which 403 has an inverted output. The first AND gate 401 has the 0° clock signal and a logic 1 as inputs and provides a normal clock signal output to the multiplexer 303, i.e. at a 50% duty cycle. The first AND gate 401 is optional, as the same effect may be achieved by directly connecting the 0° input. The second AND gate 402 has the 00 and 270° clock signals as inputs and outputs a high duty cycle clock signal to the multiplexer, i.e. at a duty cycle of 75%. The third AND gate 403 also receives the 0° and 270° clock signals and, due to the inverted output, provides a low duty cycle clock signal to the multiplexer 303, i.e. at a duty cycle of 25% (which is the inverse of the 75% duty cycle clock signal). It is not necessary to have the high and low duty cycles set to 75% and 25%. Other percentages may be chosen depending on the deviation from 50% that is considered sufficiently large to check operation of a DTC detector. The DTC select signal 216 determines which of the three clock signals is provided as the output clock signal 203. As a minimum, the logic module 302 comprises first and second AND gates 401, 402 so that the output clock signal 203 may have a duty cycle either within or outside the predetermined range. The additional AND gate 403 may be used to generate a symmetrical arrangement of duty cycle clock signals outside the predetermined range.

Figure 5:
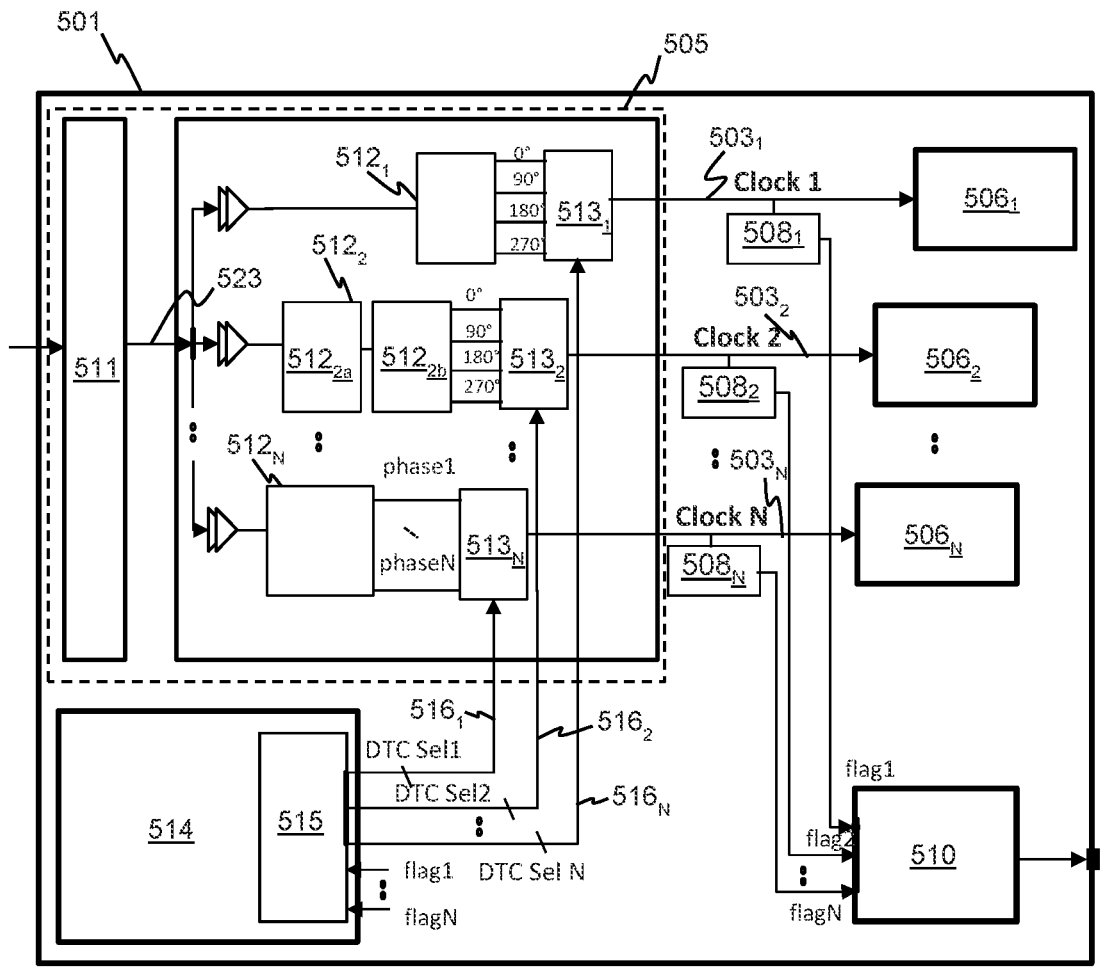
FIG. 5 is a schematic diagram of a circuit comprising a clock signal generator with multiple clock signal outputs and duty cycle detectors.

A generalised clock signal generator 505 is illustrated in FIG. 5, the clock signal generator 505 being part of a circuit 501 comprising the clock signal generator 505, a digital controller 514, a safety controller 510, a plurality of duty cycle detectors $508_{1-N}$ and a corresponding plurality of duty cycle sensitive blocks $506_{1-N}$. The clock signal generator 505 is configured to provide a corresponding plurality of clock signals $503_{1-N}$ to the respective blocks $506_{1-N}$ and duty cycle detectors $508_{1-N}$. The clock signal generator 505 comprises a corresponding plurality of dividers $512_{1-N}$ and DTC generators $513_{1-N}$. The clock signal generator 505 is provided with a crystal frequency signal and comprises a clock PLL core 511 to receive the crystal frequency signal and provide a clock signal 523 to each of the dividers $512_{1-N}$. Divider $512_1$ is shown in the form as described above in relation to FIGS. 3 and 4, while divider $512_2$ is shown as first and second dividers, a first divider $512_{2a}$ dividing the clock signal 523 by a factor M and the second divider $512_{2b}$ dividing the resulting signal by 2. Divider $512_N$ provides a plurality of clock signals with N different phases, separated by 360/N degrees, to the DTC generator 513N. In a general aspect therefore, the clock signal generator 505 comprises one or more DTC generators and one or more corresponding clock signal dividers, each clock signal divider being arranged to provide a plurality of clock signals to each respective DTC generator, the plurality of clock signals having different phases relative to each other. The number N of different phases may divide equally into 360°, or in alternative cases the distribution of phases may be unequal over the 360° range.

In operation, the digital controller 514 may enter a BIST mode, in which a select signal $516_{1-N}$ is provided to each of the DTC generators $513_{1-N}$ to cause each DTC generator $513_{1-N}$ to output a respective clock signal $503_{1-N}$ having a predetermined duty cycle set by the respective select signal $516_{1-N}$.

Figure 6:
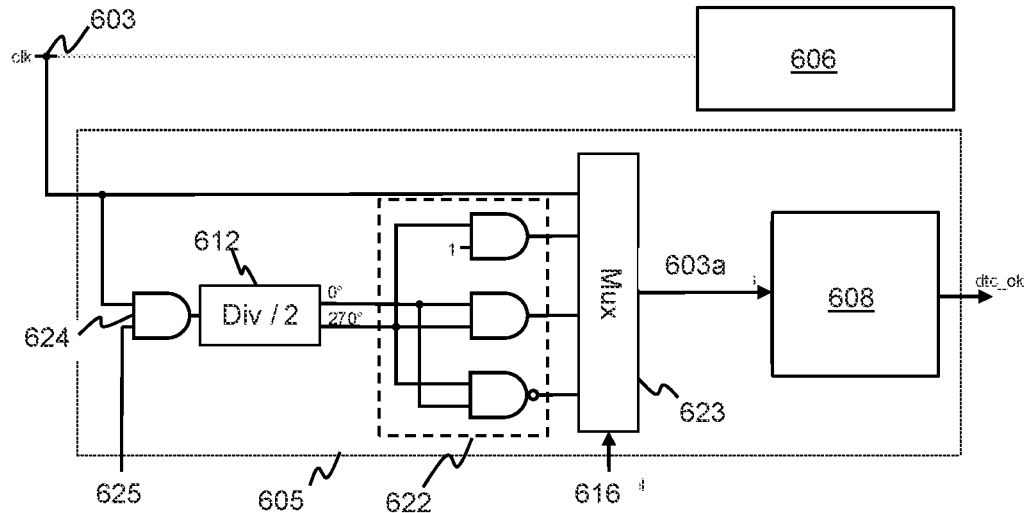
FIG. 6 is a schematic diagram of an alternative example clock signal generator.
Figure 7:
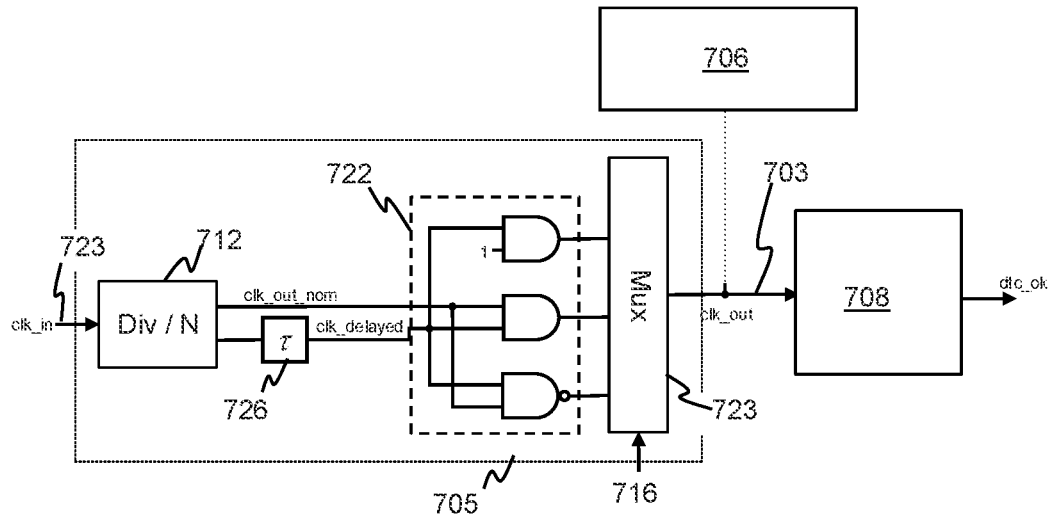
FIG. 7 is a schematic diagram of a further alternative example clock signal generator.

FIGS. 6 and 7 illustrate alternative arrangements for the clock signal generator 605, 705. In the arrangement of FIG. 6, a clock signal 603 is provided directly to a functional block 606, for example an ADC. The clock signal 603 is also provided to a duty cycle detector 608 via a multiplexer 623 dependent on a mode select signal 616 received from the controller (not shown). In a normal mode, the mode select signal 616 passes the clock signal 603 through to the duty cycle detector 608. In a self-test mode, however, the clock signal 603 is passed via a divider 612, which provides a pair of phase-shifted clock signals at a reduced frequency to a logic module 622 having a similar arrangement to that shown in FIG. 4. The logic module 622 passes clock signals having a lower frequency and with different duty cycles to the multiplexer 623, which outputs a reduced frequency clock signal 603a to the duty cycle detector 608. This arrangement enables the circuit to operate at higher frequencies without loading the divider phases with additional logic. A further advantage is that the DTC detector self-test can be carried out concurrently with functional operation of the clock 603. The divider 612 may for example be a divide by 2 divider, reducing the clock signal frequency by half. The circuit in this arrangement enables a cross-check to be carried out to determine whether a duty cycle detector is outputting a flag due to an out-of-range clock signal or due to malfunction in the detector. An AND gate 624 may be provided to receive the clock signal 603 in combination with a test enable signal 625 so that the divider 612 is only provided with the clock signal when the test enable signal 625 is high.

FIG. 7 illustrates a further alternative arrangement for the clock signal generator 705, similar to the arrangements in FIGS. 2 to 4 except that a delay element 726 is provided in one of the clock signal phases provided to the logic module 722. The delay element 726 may for example be provided by a flip flop clocked by the input clock signal 723. The components of the clock signal generator 705 are otherwise similar to those in FIG. 6, with the logic module 705 provided with a pair of clock signals having different phases and outputting clock signals with in and out of range duty cycles to a multiplexer 723, the output of which is controlled by a select signal 716 provided by a controller. The output clock signal 703 is provided to the functional block 706 and the duty cycle detector 708.

An advantage of the arrangement in FIG. 7 is that the delay element 726 enables use of a clock signal 723 with only a single phase available after division by the divider 712. If the delay introduced by the delay element 726 is dependent on the clock frequency, the duty cycle generated by the logic module 705 should be known before a check is carried out so that the out-of-range limits can be set for generating a flag output from the duty cycle detector 708.

In alternative arrangements the clock signal may be generated by a divider that itself provides a large or low duty cycle, for example a scaler divider. This may be used to provide a different method of generating deviations from a nominal 50% duty cycle. The method is similar to the above described delay method, but the delay is process dependent. If the pulse out if the divider which is assumed to have a small duty cycle is delayed by one clock this can be used instead of the delayed signal. An example of such a divider is disclosed by Cicero et al, in "A Family of Low-Power Truly Modular Programmable Dividers in Standard 0.35 mm CMOS Technology", IEEE Journal of Solid-State Circuits, Vol. 35. No. 7, July 2000.

Figure 8:
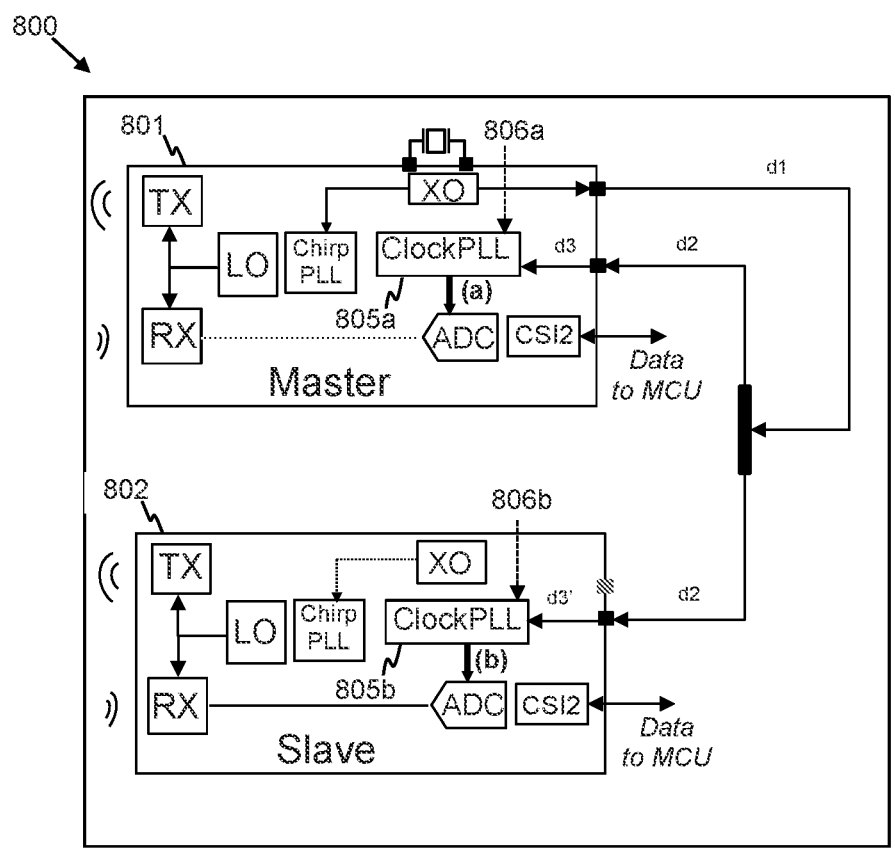
FIG. 8 is a schematic diagram of an example radar transceiver.
Figure 9:
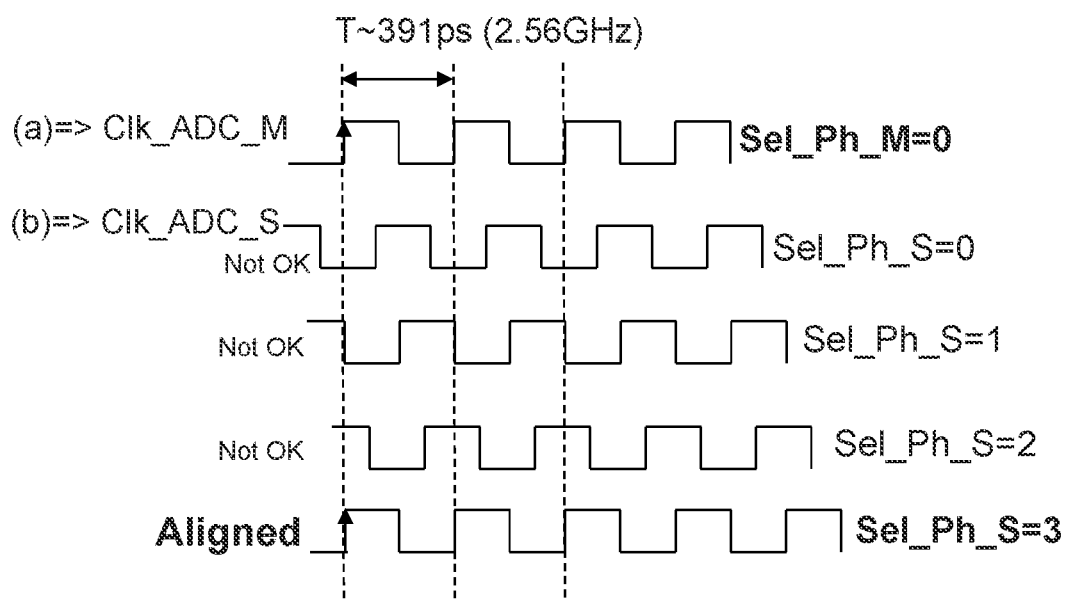
FIG. 9 is a schematic diagram illustrating multiple clock signals with varying phase relationships.

FIG. 8 illustrates schematically an example radar transceiver 800 comprising a master transceiver 801 and a slave transceiver 802. Each transceiver 801, 802 comprises a clock signal generator 805a, 805b. The phase relationship between the clock signals output by the clock signal generators 805a, 805b is set by phase select input signals 806a, 806b. FIG. 9 illustrates the phase relationship between the master and slave clock signals Clk_ADC_M, Clk_ADC_S with varying phase select signals Sel_Ph_M. Sel_Ph_S.

With the slave phase select signal set to 3 the clock signals are aligned. The example shown in FIG. 9 illustrates clock signals at 2.56 GHz, i.e. with a period T of 391 ps. Alignment of the phases of master and slave clock signal generators is necessary part of starting up the radar transceiver 800, prior to self-testing operation of any duty cycle detectors. Each clock signal generator 805a, 805b may be in the form of a clock signal generator as described above.

Figure 10:
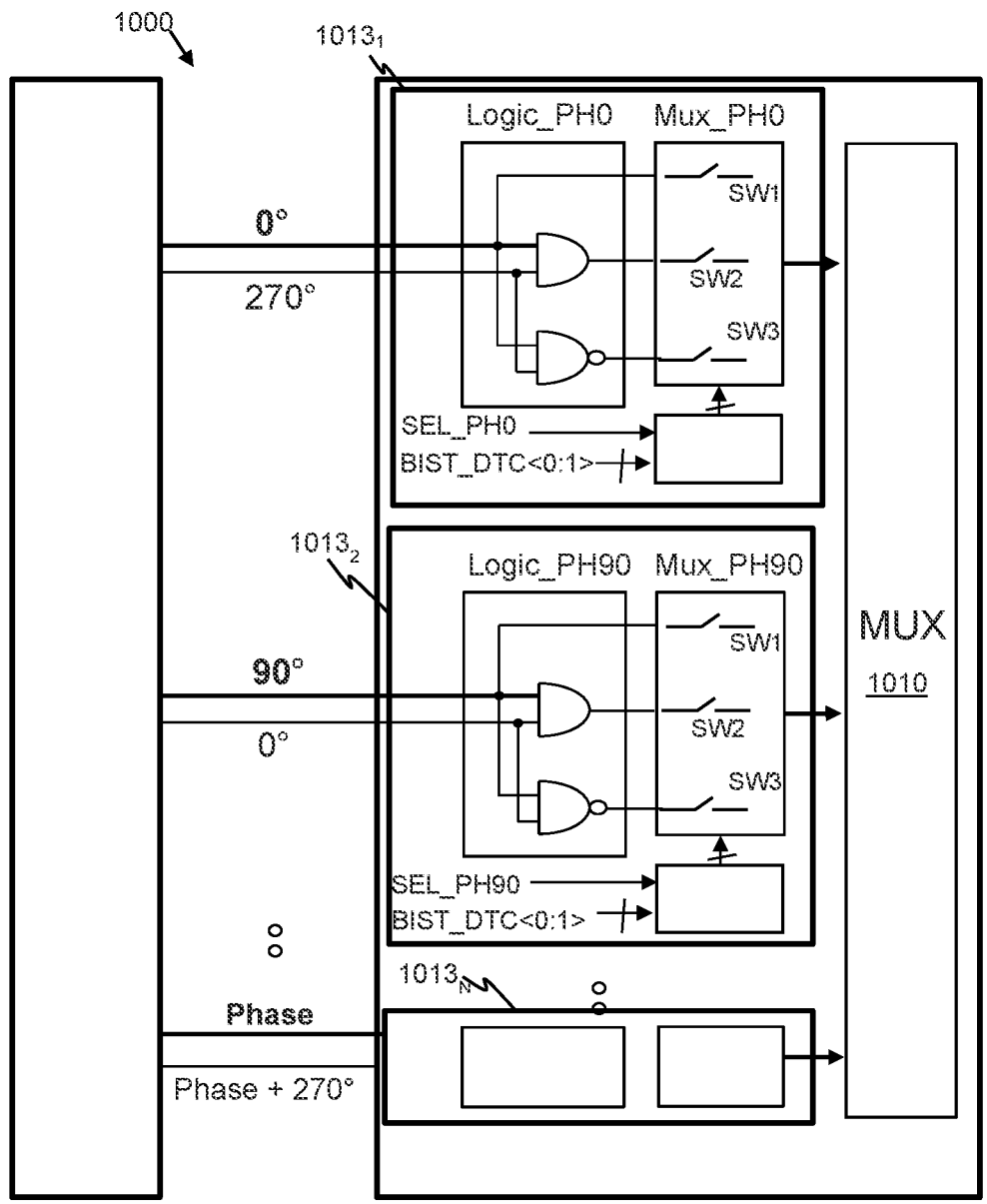
FIG. 10 is a schematic diagram of a further example clock signal generator.

FIG. 10 illustrates an example circuit 1000 in which a multi-phase clock signal generator 1012, such as a divider, provides a clock signal with multiple phases to a plurality of duty cycle generators $1013_{1-N}$. Each duty cycle generator $1013_{1-N}$ is of the form as described above in relation to FIG. 4, except that the first AND gate 401 of the logic module 302 of FIG. 4 is not provided. The outputs from each duty cycle generator are provided to a common multiplexer 1010. The circuit 1000 enables a calibrated initial phase relationship to be maintained while allowing a self-test to check operation of the duty cycle detectors. In each case, to allow for selection of a high (e.g. 75%), low (e.g. 25%) and normal (e.g. 50%) duty cycle for an arbitrary phase, the inputs for each duty cycle generator $1013_{1-N}$ comprise a first clock signal at a first phase and a second clock signal at a second phase, where the second phase is shifted from the first phase by 270°. Tables 1 and 2 below show the inputs for each duty cycle generator and the corresponding output duty cycle values. The DTC values in each case are in relation to a local reference phase, which may differ in the case of a master and slave configuration. Depending on the phase selected at the slave side to allow for alignment with the master device, as described above, the phase may be different to that of the master device. The phase value input to duty cycle generator $1013_N$ may therefore be different to the phases input to the other generators $1013_{1,2}$.

TABLE 1

Phase selection and switch values for duty cycle generator $1013_1$.

| Phase_ADC (SEL_PH) | Mode | BIST DTC<0> | BIST DTC<1> | SW1 | SW2 | SW3 | DTC Value |
|---|---|---|---|---|---|---|---|
| Sel_PH0 = 1 | Normal | 0 | 0 | closed | open | open | ~50% |
| Sel_PH0 = 1 | BIST_dtcL | 1 | 0 | open | closed | open | ~25% |
| Sel_PH0 = 1 | BIST_dtcH | 0 | 1 | open | open | closed | ~75% |

TABLE 2

Phase selection and switch values for duty cycle generator $1013_2$.

| Phase_ADC (SEL_PH) | Mode | BIST DTC<0> | BIST DTC<1> | SW1 | SW2 | SW3 | DTC Value |
|---|---|---|---|---|---|---|---|
| Sel_PH90 = 1 | Normal | 0 | 0 | closed | open | open | ~50% |
| Sel_PH90 = 1 | BIST_dtcL | 1 | 0 | open | closed | open | ~25% |
| Sel_PH90 = 1 | BIST_dtcH | 0 | 1 | open | open | closed | ~75% |

Figure 11:
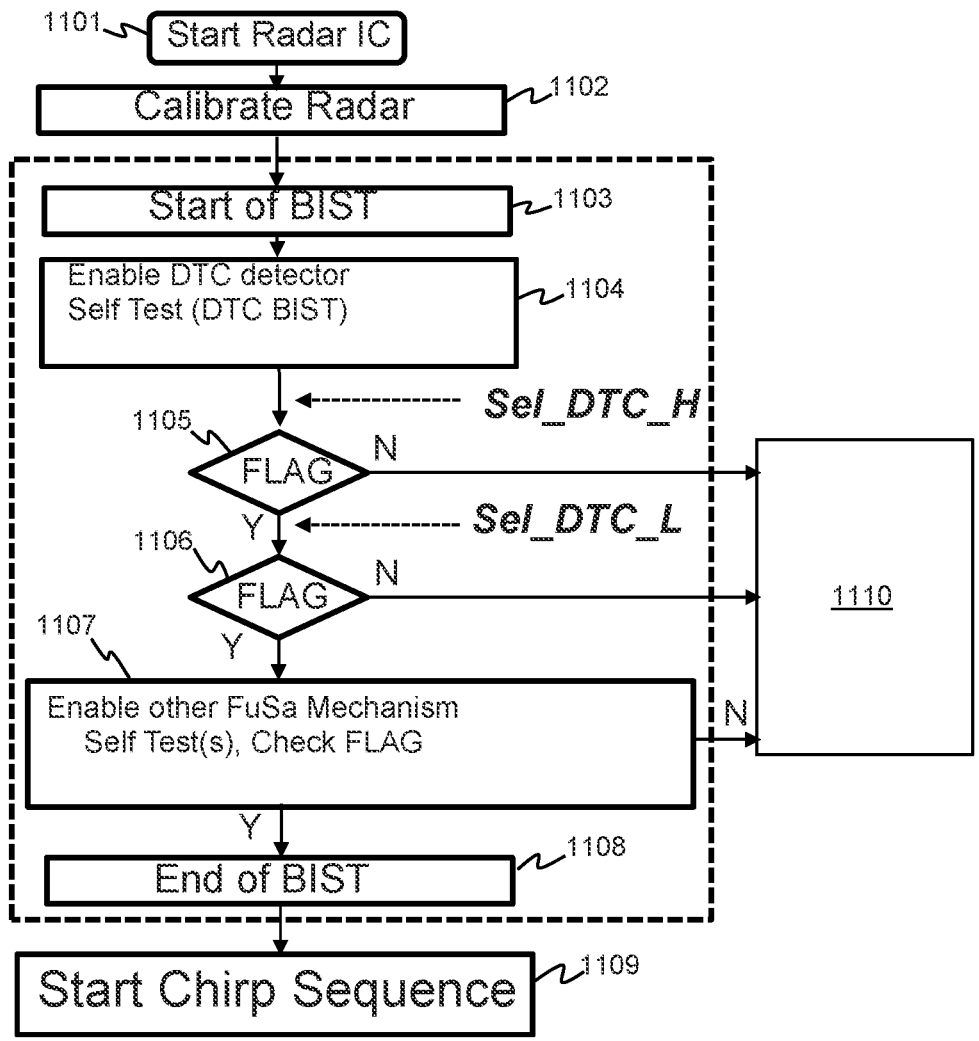
FIG. 11 is a flowchart illustrating an example method of operating a radar transceiver.

FIG. 11 illustrates an example flowchart showing a method of operating a radar transceiver during start-up, involving a self-test procedure to check operation of duty cycle detectors. The radar IC is started at step 1101, following which at step 1102 the radar is calibrated, for example by adjusting clock signal phases until master and slave transceivers are in phase. A BIST procedure is then started (step 1103), beginning with enabling a DTC detector self-test (step 1104). A first select signal Sel_DTC_H is input to the duty cycle generator of the clock signal generator to select a duty cycle above the normal duty cycle of 50%, for example at 75%. A check is done (step 1105) to determine whether the duty cycle detector outputs a flag. If a flag is output, a second select signal Sel_DTC_L to select a duty cycle below the normal duty cycle, for example 25%, and another check is carried out (step 1106). If a flag is output, other self-tests may be carried out (step 1107), following which the BIST routine ends (step 1108) and a chirp sequence begins (step 1109). If, at any of steps 1105, 1106 or 1107 an output flag is not detected, an alert is provided 1110 indicating a safety mechanism is corrupted.

An additional phase calibration step may be provided as part of step 1104 to ensure that master and slave transceivers of a radar transceiver are in a correct phase aligned relationship.

The entire sequence described above in relation to FIG. 11 may be carried out over a radar cycle of around 40 ms, with the calibration and BIST functions being performed during the first 2-8 ms, followed by a chirp sequence of 16-19 ms and a silent period of 16-19 ms. Those numbers are just examples, a different partitioning can be set. In general, calibration and BIST functions may be performed within the first 5-15% of the total time for a radar cycle, followed by a chirp sequence and a silent mode. Some or all of the BIST functions may alternatively be performed after the chirp sequence.

From reading the present disclosure, other variations and modifications will be apparent to the skilled person. Such variations and modifications may involve equivalent and other features which are already known in the art of memory systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

What is claimed is:

1. A circuit comprising:
    a clock signal generator configured to provide an output clock signal having a duty cycle, the duty cycle generator comprising a logic module and a multiplexer, the logic module arranged to combine the plurality of clock signal phases and output a plurality of clock signals with differing duty cycles to the multiplexer, the multiplexer selecting the output clock signal dependent on the duty cycle select signal;
    a duty cycle detector arranged to receive the output clock signal and provide an output flag if the duty cycle of the clock signal is outside a predetermined range, the duty cycle generator comprising a logic module and a multiplexer, the logic module arranged to combine the plurality of clock signal phases and output a plurality of clock signals with differing duty cycles to the multiplexer, the multiplexer selecting the output clock signal dependent on the duty cycle select signal;
    a controller arranged to provide a duty cycle select signal to the clock signal generator to cause the clock signal to have a duty cycle outside the predetermined range and to receive the output flag to confirm operation of the duty cycle detector.

2. The circuit of claim 1, wherein the controller is configured, in a first mode, to provide a first duty cycle select signal to cause the clock signal generator to provide the output clock signal with a first duty cycle within the predetermined range and, in a second mode, to provide a second duty cycle select signal to cause the clock signal generator to provide the output clock signal with a second duty cycle outside the predetermined range.

3. The circuit of claim 1, wherein the logic module comprises:
    a first AND gate arranged to receive one of the plurality of clock signal phases and a logic 1 and output a first clock signal having a duty cycle within the predetermined range.

4. The circuit of claim 1, wherein the logic module comprises:
    a second AND gate arranged to receive a pair of the plurality of clock signal phases and output a second clock signal having a duty cycle outside the predetermined range; and/or
    a third AND gate arranged to receive the pair of the plurality of clock signal phases and having an inverted output to output a third clock signal having a duty cycle outside the predetermined range.

5. The circuit of claim 1, wherein the plurality of clock signal phases comprise a first clock signal at a first phase and second clock signal at a second phase, the second phase being shifted from the first phase by 270°.

6. The circuit of claim 1, wherein the clock signal generator comprises a plurality of duty cycle generators each arranged to receive a plurality of clock signal phases from a respective clock signal divider and output a clock signal dependent on a duty cycle select signal received from the controller.

7. A radar transceiver comprising a clock signal generator according to claim 1.

8. The radar transceiver of claim 7 comprising master and slave transceivers each comprising a clock signal generator according to claim 1, wherein a phase of a clock signal output by each clock signal generator is adjustable according to a phase select input signal.

9. A method of testing a duty cycle detector connected to a clock signal generator in a circuit according to claim 1, the method comprising:

i) providing a duty cycle select signal to the clock signal generator to cause the clock signal to have a duty cycle outside the predetermined range; and
ii) detecting an output flag from the duty cycle detector to confirm operation of the duty cycle detector.

10. The method of claim 9, wherein step i) comprises:
ia) providing a first duty cycle select signal to the clock signal generator to cause the clock signal to have a duty cycle above the predetermined range; and
ib) providing a second duty cycle select signal to the clock signal generator to cause the clock signal to have a duty cycle below the predetermined range,
wherein step ii) comprises detecting the output flag from the duty cycle detector after both steps ia) and ib) to confirm operation of the duty cycle detector.

11. The method of claim 9 wherein the clock signal generator is part of a radar transceiver.

12. The method of claim 11 wherein the radar transceiver comprising master and slave transceivers each comprising a clock signal generator according to claim 1, the method comprising aligning a phase of a clock signal of the slave transceiver and the master transceiver to provide an aligned phase clock signal for the duty cycle generator of each clock signal generator.

13. A computer program comprising instructions to cause a controller to perform the method according to claim 11.

* * * * *